United States Patent
Okayasu

(10) Patent No.: US 6,940,330 B2
(45) Date of Patent: Sep. 6, 2005

(54) TIMING GENERATOR, SEMICONDUCTOR TEST APPARATUS, AND TIMING GENERATING METHOD

(75) Inventor: Toshiyuki Okayasu, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/828,671

(22) Filed: Apr. 21, 2004

(65) Prior Publication Data

US 2004/0196052 A1 Oct. 7, 2004

Related U.S. Application Data

(63) Continuation of application No. PCT/JP02/11053, filed on Oct. 24, 2002.

(30) Foreign Application Priority Data

Oct. 24, 2001 (JP) ..................................... 2001-326500

(51) Int. Cl.[7] ............................................. H03H 11/26
(52) U.S. Cl. ........................ 327/261; 327/262; 327/286
(58) Field of Search ................................. 327/149, 161, 327/151–156, 162, 261, 265, 270, 273, 279, 286; 326/16, 93

(56) References Cited

U.S. PATENT DOCUMENTS

| | | | | |
|---|---|---|---|---|
| 5,488,325 A | * | 1/1996 | Sato et al. | .................. 327/286 |
| 5,604,468 A | * | 2/1997 | Gillig | .......................... 331/176 |
| 5,712,582 A | | 1/1998 | Yokota et al. | |
| 5,764,598 A | | 6/1998 | Okayasu | ..................... 368/120 |
| 5,942,902 A | | 8/1999 | Okayasu | ..................... 324/617 |
| 6,188,637 B1 | * | 2/2001 | Ooishi | ......................... 365/233 |
| 6,587,983 B1 | * | 7/2003 | Nakayama | .................. 714/736 |
| 6,598,212 B2 | * | 7/2003 | Okayasu | ........................ 716/4 |

FOREIGN PATENT DOCUMENTS

JP           9-304488       11/1997     ....... G01R/31/3183

OTHER PUBLICATIONS

Patent Abstracts of Japan; Publication No. 09-304488 dated Nov. 28, 1997 (1 pg).
International Search Report mailed Feb. 12, 2003 (2 pgs.).

* cited by examiner

*Primary Examiner*—Timothy P. Callahan
*Assistant Examiner*—Hai L. Nguyen
(74) *Attorney, Agent, or Firm*—Osha Liang LLP

(57) ABSTRACT

A timing generator includes a reference signal generating unit for generating a reference signal of a predetermined frequency, a variable delay circuit unit for outputting the timing signal which results from delaying the reference signal by a predetermined time, and a delay amount measuring unit for measuring a delay amount of the variable delay circuit unit, whereby the timing generator controls the delay amount of the variable delay circuit unit based on the delay amount measured by the delay amount measuring unit. Since the frequency of the reference signal is continuously modulated within a very small frequency range, the delay amount measuring unit can measure the delay amount of the variable delay circuit unit highly accurately. In addition, since the delay amount of the variable delay circuit unit can be controlled on the basis of the measured delay amount, it is possible to generate the accurately delayed timing signal.

13 Claims, 7 Drawing Sheets

PRIOR ART

TIMING GENERATOR, SEMICONDUCTOR TEST APPARATUS, AND TIMING GENERATING METHOD

The present application is a continuation application of PCT/JP02/11053 filed on Oct. 24, 2002, which claims priority from a Japanese patent application No. 2001-326500 filed on Oct. 24, 2001, the contents of which are incorporated herein by reference.

FIELD OF THE INVENTION

The present invention relates to a timing generator for generating a timing signal which results from delaying a reference signal by a predetermined time, a semiconductor test apparatus, and a timing generating method. More particularly, the present invention relates to a timing generator for measuring the delay amount of the reference signal with high precision and controlling the delay amount, a semiconductor test apparatus, and a timing generating method.

RELATED ART

FIG. 1 shows a conventional timing generator 100. The timing generator 100 includes a reference signal generating unit 10, a selecting unit 12, a variable delay circuit unit 14, a control unit 16, a waveform adjustment circuit 32, and a frequency counter 18. The timing generator 100 is used in a semiconductor test apparatus which tests a semiconductor device.

The reference signal generating unit 10 generates and supplies a reference signal a predetermined frequency to the selecting unit 12 and the control unit 16. And the reference signal generating unit 10 supplies the reference signal to other parts of the semiconductor test apparatus, when the timing generator 100 is being used in the semiconductor test apparatus. The selecting unit 12 selects either of the reference signal supplied from the reference signal generating unit 12 or the signal outputted by the waveform adjustment circuit 32, and outputs it to the variable delay circuit unit 14. The variable delay circuit unit 14 delays and outputs the signal selected by the selecting unit 12 as much as a predetermined time. The control unit 16 controls the delay amount of the variable delay circuit unit 14.

The timing generator 100 checks whether the first delay amount of the variable delay circuit unit 14 is a desired delay amount or not. As shown in FIG. 1, a start pulse is inputted into the timing generator 100. The selecting unit 12 selects a route B, and a loop along which the output of the variable delay circuit unit 14 is fed back to the input of the variable delay circuit unit 14 is formed. The start pulse circulates the loop formed. The start pulse is delayed as much as a predetermined delay amount by the variable delay circuit unit 14 whenever it circulates the loop. In other words, an oscillating signal whose period is approximately equal to the delay amount of the variable delay circuit unit 14 is generated.

The conventional timing generator 100 can calculate the delay amount of the variable delay circuit unit 14 by measuring the frequency of the oscillating signal of the loop. The frequency counter 18 is a counter which measures the number of circulations of the oscillating signal around the loop. The frequency of the signal of the feedback loop, i.e. the delay amount of the variable delay circuit unit 14 is calculated based on the number of circulations measured by the frequency counter 18. The control unit 16 controls the delay amount of the variable delay circuit unit 14 to be a desired delay amount based on the calculated delay amount.

Since it is generally necessary to accurately match the delay amount of the variable delay circuit unit 14 with the desired delay amount, the oscillation period of the loop is calculated in response to a delay setting value of the variable delay circuit unit 14 while the delay setting value is changed. The control unit 16 controls the delay amount of the variable delay circuit unit 14 in order that an expected value of the delay change amount in response to the change of the delay setting value matches with the change amount of the oscillation period. Accordingly, the delay time which exists as a constant offset, e.g. the delay time by a circuit except the variable delay circuit unit 14 can be canceled by calculation. However, for the sake of description, the offset delay amount of the loop is hereinafter considered zero.

After the delay amount of the variable delay circuit unit 14 is adjusted, the selecting unit 12 selects a route A, and inputs the reference signal generated by the reference signal generating unit 10 to the variable delay circuit unit 14. The variable delay circuit unit 14 delays and outputs the inputted reference signal as much as the adjusted delay amount.

In the conventional timing generator 100, however, the noise of the reference signal supplied to other parts affects the oscillating signal of the loop, because when the reference signal generating unit 10 is being used in the semiconductor test apparatus, the reference signal is also supplied even to the other parts. Therefore, it is difficult to measure the frequency of the oscillating signal of the loop with high precision. For example, if the period of the reference signal is given by a value close to the delay amount of the variable delay circuit unit 14, the period of the signal of the feedback loop of the timing generator 100 becomes equal to the period of the reference signal. In other words, that is an absorption phenomenon. Hereinafter, the absorption phenomenon will be described.

FIGS. 2A to 2E show the absorption phenomenon. The reference signal generated by the reference signal generator 10, as shown in FIG. 2A, is a rectangular wave signal of period $T_1$. And the period $T_1$ is a little smaller than the delay amount $T_2$ of the variable delay circuit unit 14. The noise shown in FIG. 2B caused by the reference signal shown in FIG. 2A is overlapped on the oscillating signal of the loop.

The oscillating signal by the start pulse supplied to the loop, if the effect of the noise is ignored, as shown in FIG. 2C, has its period approximately equal to the delay amount $T_2$ of the variable delay circuit unit 14. That is, measuring the period of the oscillating signal shown in FIG. 2C makes it possible to calculate the delay amount $T_2$ of the variable delay circuit unit 14. As a matter of fact, however, due to the effect of the noise shown in FIG. 2B, the period of the loop has a value different from the delay amount $T_2$ of the variable delay circuit unit 14. FIG. 2D shows the oscillating signal in the loop shown in FIG. 2C overlapped by the noise in FIG. 2B. First, the start pulse shown as the rectangular wave 22c in FIG. 2C is applied to the timing generator 100. The start pulse is synchronized with one of the rectangular waves of the reference signal. The rectangular wave 22d results from overlapping the noise and the rectangular wave 22c by the start pulse. The rectangular wave 22d is adjusted by the waveform adjustor 32, and inputted to the variable delay circuit unit 14 via the selecting unit 12. The adjusted rectangular wave 22d is delayed as much as a predetermined time by the variable delay circuit unit 14, and becomes the rectangular wave 24d overlapped by the noise in FIG. 2B. If the period of the rectangular waves 22d and 24d is $T_3$, the period $T_3$ should be equal to the delay amount $T_2$ of the variable delay circuit unit 14, but it can't be so due to the overlapped noise. In this case, since the period $T_1$ of the noise is a little smaller than the delay amount of the variable delay circuit unit 14, it becomes a value close to the period $T_1$, i.e. $T_2$-α. The rectangular wave 24d is adjusted by the waveform adjustor 32, and becomes the rectangular wave 24e shown in FIG. 2E. FIG. 2E shows the signal resulting from adjusting the signal shown in FIG. 2D. The rectangular wave 24e is delayed by the variable delay circuit unit 14, and becomes the rectangular wave 26d on which the noise is overlapped. The rectangular wave 26d is the signal resulting from delaying not the rectangular wave 24c but the rectangular wave 24e by the variable delay circuit unit 14. In addition, although the rectangular wave 26d is the signal resulting from delaying the rectangular wave 24e as much as the delay amount $T_2$ of the variable delay circuit unit 14, the delay amount becomes a value far closer to $T_1$ than $T_2$-α due to the effect of the noise.

By repeating the above loop, the period of the oscillating signal becomes close to the period of the reference signal. After repetition predetermined times, the period of the oscillating signal reaches an equilibrium state. In other words, if the period of the reference signal is given by a value close to the delay amount of the variable delay circuit unit 14 and constant, the effect of the noise caused by the reference signal on the period of the oscillating signal is accumulated until the period of the oscillating signal reaches the equilibrium slate. Since the period of the reference signal and the delay amount of the variable delay circuit unit 14 are close values, the period of the oscillating signal having reached the equilibrium state continues receiving the effect of the noise caused by the reference signal and taking the same period as that of the reference signal. The period of the oscillating signal having reached the equilibrium state becomes approximately equal to the period of the reference signal. Accordingly, there occurs an error between the period of the oscillating signal and the delay amount of the variable delay circuit unit 14, and thus it is difficult to calculate the delay amount $T_2$ of the variable delay circuit unit 14 with high precision. Therefore, it is difficult to control the delay amount of the variable delay circuit unit 14 with high precision. In addition, it is difficult to test a semiconductor device with high precision when the timing generator 100 is being used in the semiconductor test apparatus.

SUMMARY OF THE INVENTION

Accordingly, it is an object of the present invention to provide a timing generator, a semiconductor test apparatus and a timing generating method, which is capable of overcoming the above drawbacks accompanying the conventional art. The above and other objects can be achieved by combinations described in the independent claims. The dependent claims define further advantageous and exemplary combinations of the present invention.

In order to solve the problems above, according to the first aspect of the present invention, a timing generator for generating a timing signal by delaying a reference signal as much as a predetermined time includes a reference signal generating unit for generating the reference signal of a predetermined frequency, a modulating unit for modulating the frequency of the reference signal generated by the reference signal generating unit, a variable delay circuit unit for receiving the reference signal and outputting the timing signal which results from delaying the reference signal as much as a predetermined time, and a delay amount measuring unit for measuring a delay amount of the variable delay circuit unit.

The reference signal generating unit may supply the reference signal to a circuit including the variable delay circuit unit.

The modulating unit may continue modulating the frequency of the reference signal for a predetermined time.

The timing generator may further include a control unit for controlling the delay amount of the variable delay circuit unit based on the delay amount measured by the delay amount measuring unit.

The delay amount measuring unit may include a signal feedback unit for feeding back the timing signal to an input of the variable delay circuit unit, and the delay amount measuring unit may measure a frequency of an oscillating signal oscillated because the signal feedback unit feeds back the timing signal to the variable delay circuit unit, and calculate the delay amount of the variable delay circuit unit based on the measured frequency of the oscillating signal.

The modulating unit may include a phase comparator for receiving two signals and outputting a phase difference signal of a voltage value based on a frequency difference between the two signals, an overlap unit for overlapping a modulation signal on the phase difference signal, a voltage-controlled variable frequency oscillator for receiving the phase difference signal overlapped by the modulation signal and outputting an output signal whose frequency increases or decreases in proportion to the voltage value of the phase difference signal, and a frequency divider for feeding back a period of the output signal multiplied by an integer to a first input of the phase comparator, and the reference signal may be inputted to a second input of the phase comparator.

The overlap unit may overlap the modulation signal whose voltage value continues changing for a predetermined time on the phase difference signal.

According to the second aspect of the present invention, a test apparatus for testing a semiconductor device includes a pattern generating unit for generating a reference signal of a predetermined frequency and a test signal for a test of the semiconductor device, a timing generator for receiving the reference signal and outputting a timing signal which results from delaying the reference signal as much as a predetermined time, a waveform adjustor for receiving the test signal and timing signal and supplying an adjusted signal which results from delaying the test signal based on the timing signal to the semiconductor device, and a judging unit for receiving an output signal from the semiconductor device in response to the adjusted signal and judging quality of the semiconductor device based on the output signal, wherein the timing generator includes a modulating unit for modulating the frequency of the reference signal generated by the pattern generating unit, a variable delay circuit unit for receiving the reference signal and outputting the timing signal which results from delaying the reference signal as much as a predetermined time, and a delay amount measuring unit for measuring a delay amount of the variable delay circuit unit.

According to the third aspect of the present invention, a timing generating method for generating a timing signal which results from delaying a reference signal much as a predetermined time including a modulation step of modulating a frequency of the reference signal, a delay step of receiving the reference signal and outputting the timing signal which results from delaying the reference signal as much as a predetermined time, and a delay amount measurement step of measuring a delay amount of the delay step.

The timing generating method may further include a control step of controlling the delay amount of the delay step based on the delay amount measured the delay amount measurement step.

The delay amount measurement step may include a signal feedback step of feeding back the timing signal to an input with regard to the delay step, and in the delay amount measurement step, a frequency of an oscillating signal oscillated because the timing signal is fed back to the input with regard to the delay step in the signal feedback step may be measured, and the delay amount of the delay step may be calculated based on the measured frequency of the oscillating signal.

The summary of the invention does not necessarily describe all necessary features of the present invention. The present invention may also be a sub-combination of the features described above.

BRIEF DESCRIPTION OF DRAWINGS

FIG. 2A shows an example of a reference signal. FIG. 2B shows an example of a noise. FIG. 2C shows an example of an oscillating signal with the effect of the noise being ignored. FIG. 2D shows an example of the oscillating signal affected by the noise. FIG. 2E shows an example of an adjusted oscillating signal.

FIG. 4A shows an example of a reference signal. FIG. 4B shows an example of a noise. FIG. 4C shows an example of an oscillating signal with the effect of the noise being ignored. FIG. 4D shows an example of the oscillating signal affected by the noise. FIG. 4E shows an example of an adjusted oscillating signal.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 3:
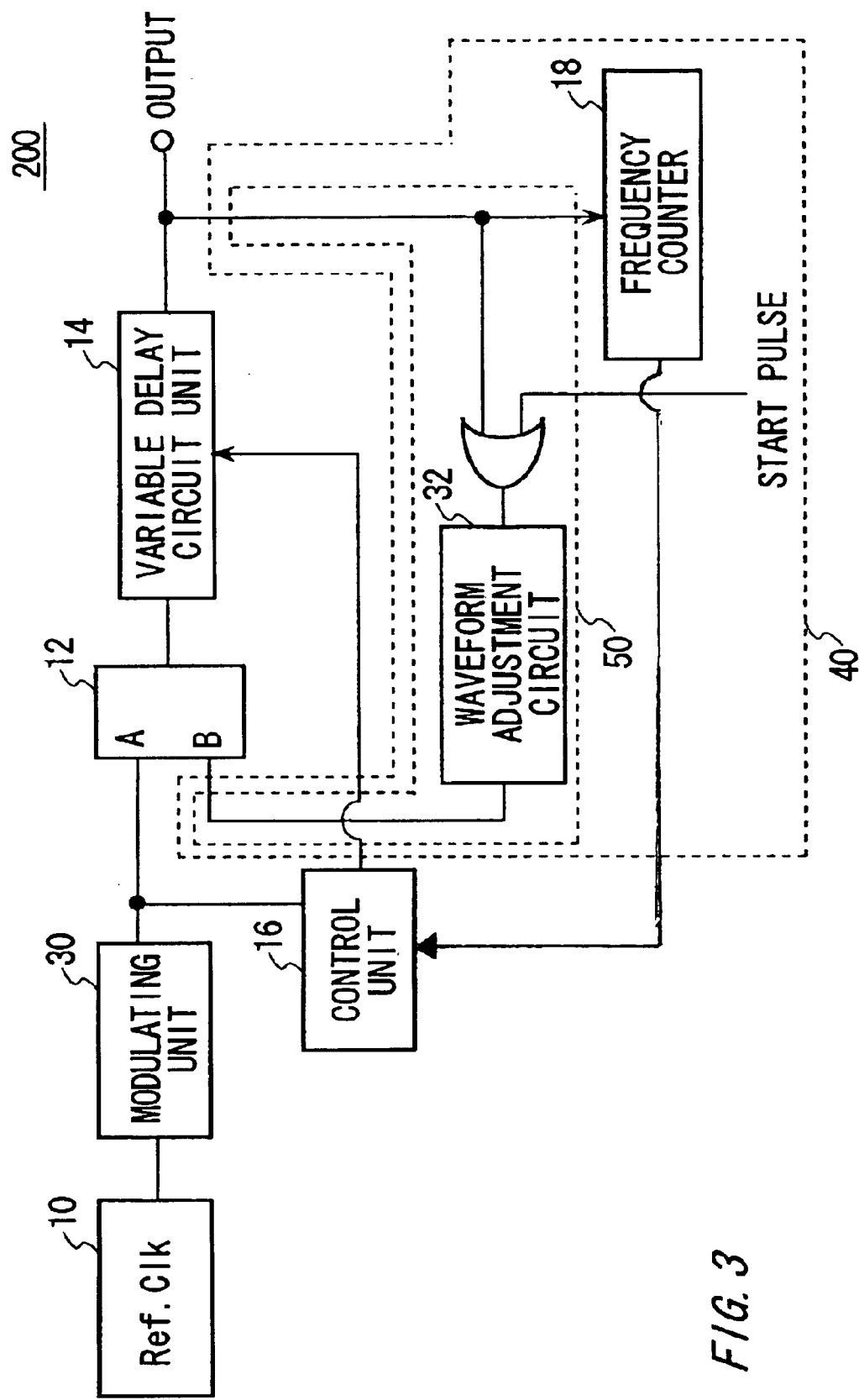
FIG. 3 shows an example of the configuration of a timing generator 200 in this invention.

FIG. 3 shows an example of the configuration of a timing generator 200 of the present invention. The timing generator 200 includes a reference signal generating unit 10, a modulating unit 30, a control unit 16, a selecting unit 12, a variable delay circuit unit 14, and a delay amount measuring unit 40. The reference signal generating unit 10 generates the reference signal of a predetermined frequency. The reference signal is inputted to the selecting unit 12 and the control unit 16 via the modulating unit 30. The modulating unit 30 modulates the frequency of the reference signal generated by the reference signal generating unit 10. The modulating unit 30 preferably continues modulating the frequency of the reference signal for a predetermined time. The modulating unit 30 supplies the reference signal of modulated frequency to the control unit 16 and the selecting unit 12. In addition, when the timing generator 200 is being used in the semiconductor test apparatus, the reference signal generating unit 10 may supply the reference signal to other circuits (not shown) which include the variable delay circuit unit 14 via the modulating unit 30. For example, when the timing generator 100 is being used in the semiconductor test apparatus, the reference signal generating unit 10 supplies the reference signal of modulated frequency to other apparatuses of the semiconductor test apparatus as well. The selecting unit 12 selects either of the supplied reference signal or the signal outputted by the waveform adjustment circuit 32, and supplied it to the variable delay circuit unit 14. The control unit 16 controls the delay amount of the variable delay circuit unit 14 at the timing based on the supplied reference signal. The variable delay circuit unit 14 outputs the timing signal which results from delaying the supplied reference signal by a predetermined time. And the control unit 16 controls the variable delay circuit unit 14 to generate a predetermined delay amount in response to the received signal.

The delay amount measuring unit 40 measures the delay amount generated by the variable delay circuit unit 14. The delay amount measuring unit 40 includes a frequency counter 18 and a signal feedback unit 50. The signal feedback unit 50 includes a waveform adjustment circuit 32. When the delay amount measuring unit 40 measures the delay amount of the variable delay circuit unit 14, the selecting unit 12 selects the route B, and a loop is formed by the variable delay circuit unit 14 and the signal feedback unit 50. The signal feedback unit 50 is inputted with a start pulse. The start pulse is a signal of one pulse. The start pulse inputted by the signal feedback unit 50 is inputted to the variable delay circuit unit 14 via the waveform adjustment circuit and the selecting unit 12. The variable delay circuit unit 14 delays the inputted start pulse by a predetermined time and outputs it to the signal feedback unit 50. The outputted start pulse is fed back to the input of the variable delay circuit unit 14 via the signal feedback unit 50 and the selecting unit 12. By repeating this feedback, the oscillating signal which circulates the loop including the variable delay circuit unit 14 and the signal feedback unit 50 is generated.

The frequency counter 18 counts the number of circulations of the oscillating signal around the loop including the variable delay circuit unit 14 and the signal feedback unit 50 for a predetermined time. The delay amount of the variable delay circuit unit 14 is calculated on the basis of the number of circulations of the oscillating signal which is measured. Since the timing generator 200 of this invention prevents the effect of the noise caused by the reference signal from accumulating by modulating the frequency of the reference signal, it is possible to calculate the delay amount generated by the variable delay circuit unit 14 with high precision. For the entire oscillating signal, the effect of the noise caused by the reference signal can be eliminated. Hereinafter, the period of the oscillating signal when the frequency of the reference signal is modulated will be described by way of examples.

FIGS. 4A to 4E show an example of the period of the oscillating signal when the frequency of the reference signal is modulated. FIG. 4A shows the reference signal supplied by the reference signal generating unit 10 via the modulating unit 30. The reference signal generating unit 10 generates a rectangular wave signal of a period $T_4$, and the modulating unit 30 modulates and outputs the frequency of the rectangular wave signal generated by the reference signal generating unit 10. In this embodiment, the period of the reference signal generated by the reference signal generating unit 10 is $T_4$ plus or minus a very short time.

FIG. 4B shows an example of the noise caused by the reference signal. The period of the noise is equal to that of the reference signal. FIG. 4C shows the oscillating signal caused by the start pulse if the effect of the noise is ignored. The rectangular wave 44c is the rectangular wave caused by the start pulse. The rectangular wave 44c is supposed to be synchronized with one of the rectangular waves of the reference signal. The period of the oscillating signal shown in FIG. 4C is approximately equal to the delay amount $T_5$ of the variable delay circuit unit 14.

FIG. 4D shows a signal which results from overlapping the noise shown in FIG. 4B onto the oscillating signal shown in FIG. 4C. The rectangular wave 44d is delayed by the variable delay circuit unit 14, and becomes the rectangular wave 46d. The period of the rectangular waves 44d and 46d becomes a value which results from shifting the delay amount $T_5$ a little to the period $T_4$ of the reference signal due to the effect of the noise. The rectangular wave 46d is adjusted by the waveform adjustment circuit 32, and becomes the rectangular wave 46e shown in FIG. 4E. FIG. 4E shows the signal which results from adjusting the signal shown in FIG. 4D. The rectangular wave 46e is delayed by the variable delay circuit unit 14, and becomes the rectangular wave 48d. Since the timing generator 200 of this embodiment modulates the frequency of the reference signal, the timing of the rectangular wave 48d and the timing of the noise caused by the reference signal can be shifted. Accordingly, the period of the rectangular waves 46d and 48d receives the effect of the noise caused by the reference signal, and becomes equal to the delay amount $T_5$ of the variable delay circuit unit 14. Further, that is the same for the rectangular wave 48d or later. In other words, although any rectangular wave receives the effect of the noise and then its period becomes different from $T_5$, the next rectangular wave is not affected by the noise, and its period becomes equal to the delay amount $T_5$ of the variable delay circuit unit 14. In addition, even if a plurality of rectangular waves receive the effect of the noise and the period between them becomes different from $T_5$, the period of the noise is modulated to be generated at the timing, so that it cannot affect the oscillating signal, and thus the period of the oscillating signal is adjusted to become the delay amount $T_5$ of the variable delay circuit unit 14. Accordingly, the period of the entire oscillating signals becomes equal to the delay amount $T_5$ of the variable delay circuit unit 14.

In the conventional timing generator, since the period of the reference signal is constant, if the period of the reference signal is close to the delay amount of the variable delay circuit unit 14, once the oscillating signal receives the effect of the noise, the period of the oscillating signal is absorbed to the period of the reference signal. In the timing generator 200 described in connection with FIGS. 3 and 4, however, since it modulates the period of the reference signal and the period of the noise caused by the reference signal, it changes the timing at which the noise affects the oscillating signal. Therefore, it is possible to prevent the period of the oscillating signal from being absorbed to the period of the reference signal.

Although it is the noise caused by the reference signal generated by the reference signal generating unit 10 that has been described, alternatively the timing generator 200 may include a modulating unit for modulating the frequency of the noise due to other causes.

Figure 5:
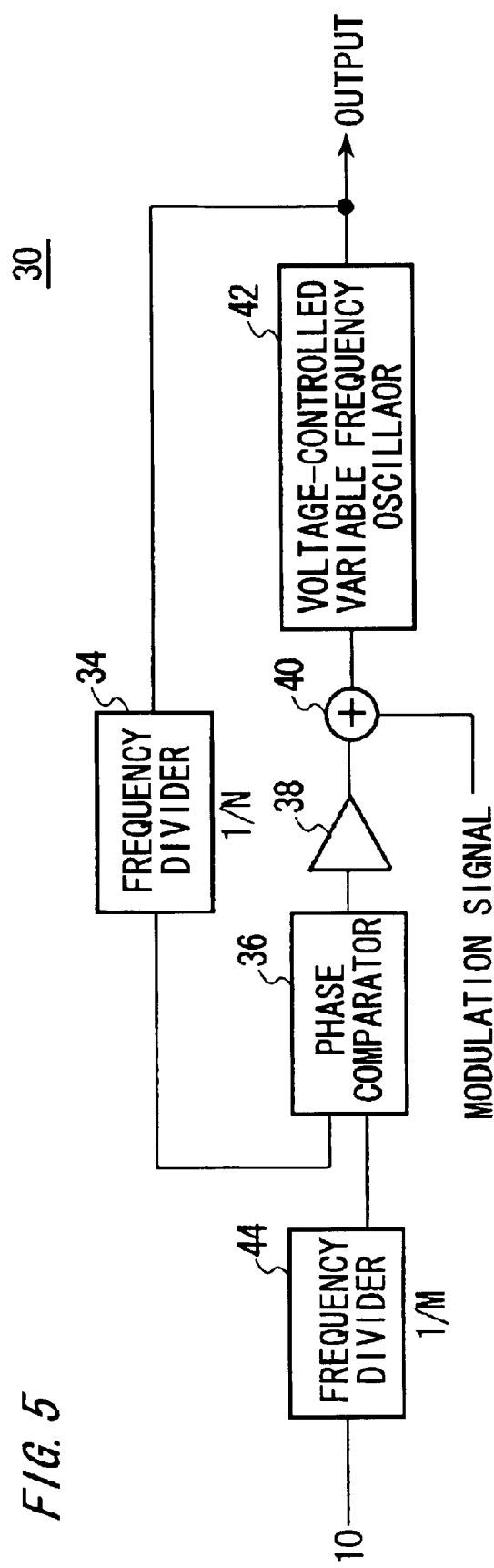
FIG. 5 shows an example of the configuration of a modulating unit 30.

FIG. 5 shows an example of the configuration of the modulating unit 30. The modulating unit 30 includes a frequency divider 32, a frequency divider 34, a phase comparator 36, an amplifier 38, an overlap unit 40, and a voltage-controlled variable frequency oscillator 42.

The frequency divider 44 multiplies the frequency of the reference signal inputted from the reference signal generating unit 10 (cf. FIG. 3) by 1/M (M is a natural number), and supplies it to the phase comparator 36. The phase comparator 36 receives two inputted signals, and outputs a phase difference signal of a voltage value based on the phase difference between the two signals. The amplifier 38 receives the phase difference signal outputted by the phase comparator 36, and supplies a signal which results from amplifying the phase difference signal in a predetermined proportion to the overlap unit 40. The overlap unit 40 overlaps a predetermined modulation signal onto the received signal from the amplifier 38, and supplied it to the voltage-controlled variable frequency oscillator 42. The overlap unit 40 preferably overlaps the modulation signal whose voltage value continues changing for a predetermined time onto the phase difference signal. The voltage-controlled variable frequency oscillator 42 outputs an output signal of a frequency based on the voltage value of the signal received from the overlap unit 40. The frequency divider 34 receives the output signal outputted by the voltage-controlled variable frequency oscillator 42, and feeds back the signal which results from multiplying the frequency of the output signal by 1/N (N is a natural number) to the input of the phase comparator 36.

Figure 1:
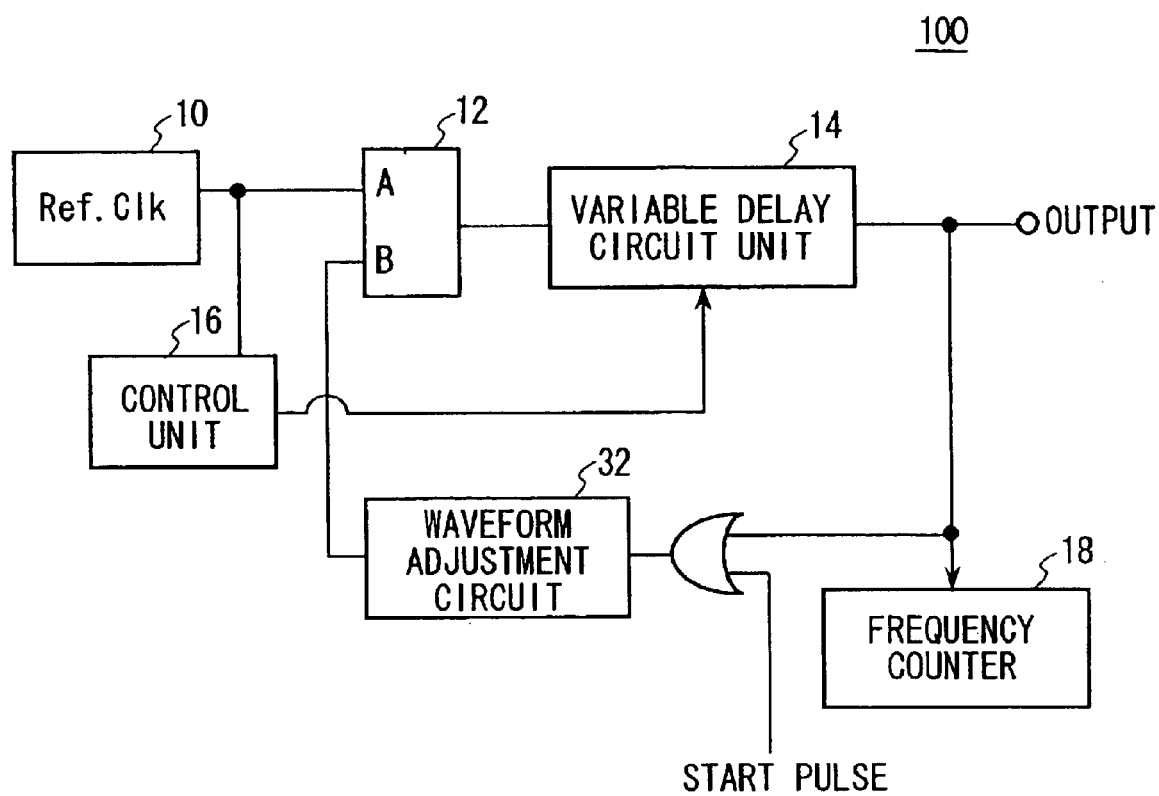
FIG. 1 shows an example of the configuration of a conventional timing generator 100.
Figure 2:
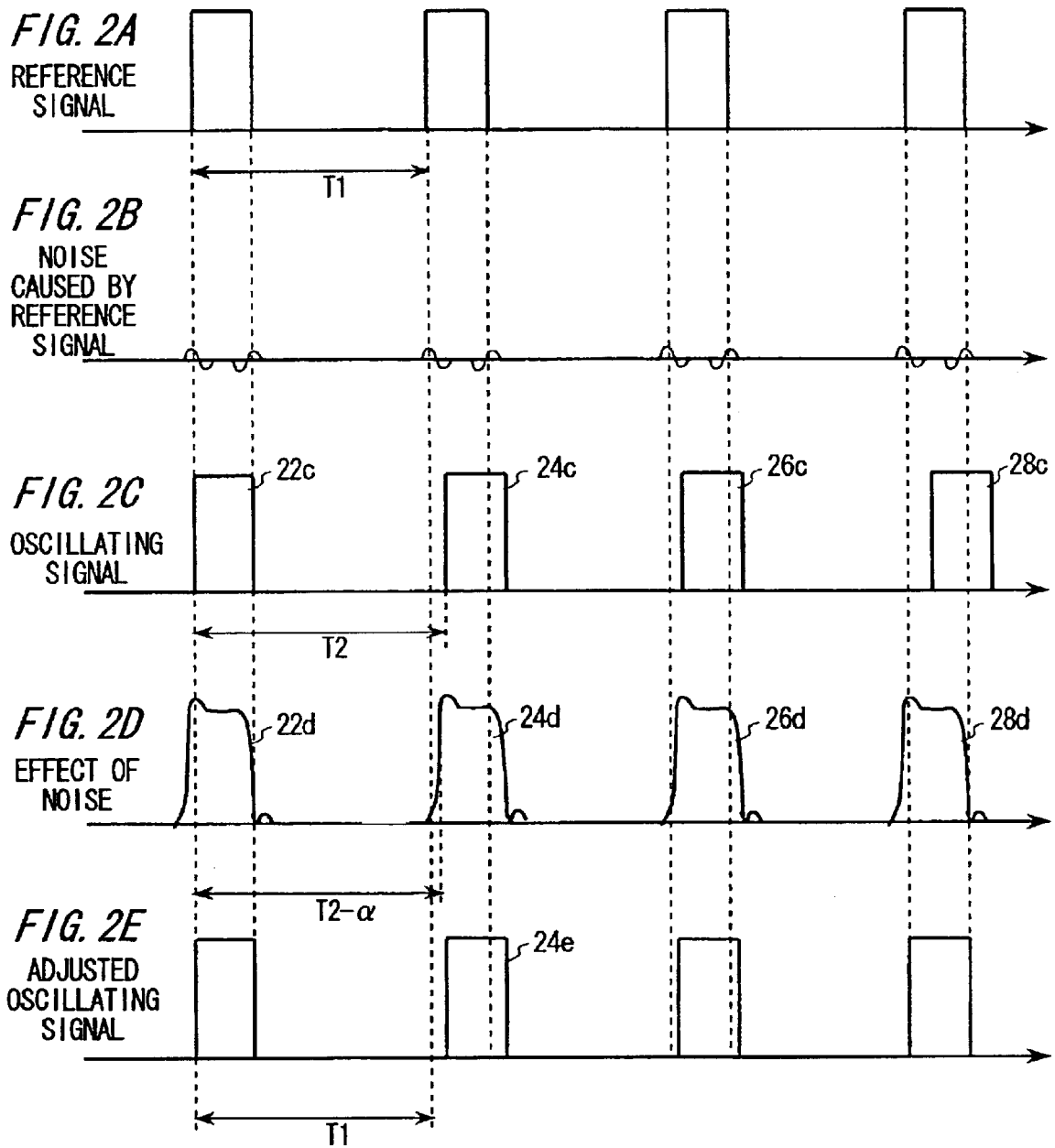
FIG. 2 shows the absorption phenomenon in the conventional timing generator 100.

According to the modulating unit 30 described in this embodiment, the signal which results from modulating the frequency of the inputted reference signal can be outputted. The modulation signal to be overlapped by the overlap unit 40 may be a sine wave, a white noise, etc. The frequency of the output signal outputted from the modulating unit 30 is modulated within a very narrow frequency range with the frequency of the reference signal inputted to the modulating unit 30 multiplied by N/M being considered as a reference. The signal outputted from the modulating unit 30 is not only supplied to the timing generator 200 but also to other apparatuses, so it is preferable that the frequency range within which the signal outputted by the modulating unit 30 is modulated should not affect the operation of the other apparatuses. For example, the period in response to the frequency range within which the modulating unit 30 performs frequency modulation may be a few picoseconds to a few tens of picoseconds. According to the timing generator of this invention, since the frequency of the signal is modulated to be a few picoseconds to a few tens of picoseconds, it is possible to prevent the absorption phenomenon described in connection with FIGS. 1 and 2 while the operation of other apparatuses except the timing generator 200 is hardly affected by the noise. In addition, the modulating unit 30 may modulate the frequency of the reference signal only when the delay amount measuring unit 40 measures the delay amount of the variable delay circuit unit 14.

Figure 6:
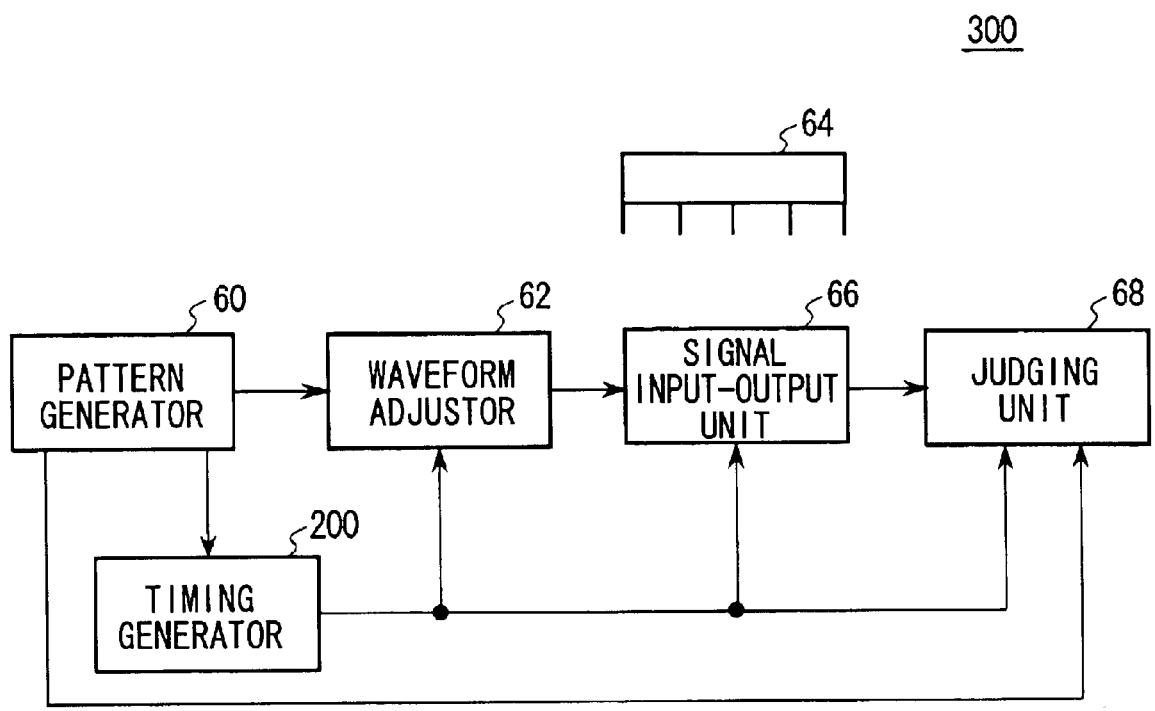
FIG. 6 shows an example of the configuration of a semiconductor test apparatus 300.

FIG. 6 shows an example of the configuration of the semiconductor test apparatus 300 for judging the quality of a semiconductor device. The semiconductor test apparatus 300 includes a pattern generator 60, a waveform adjustor 62, a signal input-output unit 66, a judging unit 68 and a timing generator 200. The pattern generator 60 generates a reference signal of a predetermined frequency and a test signal for the test of the semiconductor device 64. The pattern generator 60 supplies the reference signal of a predetermined frequency to the timing generator 200, and the test signal to the waveform adjustor 62. The timing generator 200 may have the same function and configuration as those of the timing generator 200 described in connection with FIGS. 3 to 5. In this case, the reference signal generating unit 10 of the timing generator 200 described in connection with FIGS. 3 to 5 supplies the reference signal received from the pattern generator 60 to the modulating unit 30 as it is.

The timing generator 200 delays the received reference signal by a predetermined time, and supplies the delayed timing signal to the waveform adjustor 62, the signal input-output unit 66, and the judging unit 68. The timing signals supplied to the waveform adjustor 62, the signal input-output unit 66, and the judging unit 68 may be different from each other. The waveform adjustor 62 adjusts the received test signal, and supplies it to the signal input-output unit 66 at the timing based on the received timing signal. The signal input-output unit 66 inputs the test signal received from the waveform adjustor 62 to the semiconductor device 64 at the timing based on the received timing signal. And the signal input-output unit 66 receives the signal outputted by the semiconductor device 64 based on the inputted test signal, and outputs it to the judging unit 68. The judging unit 68 judges the quality of the semiconductor device 64 based on the signal received from the signal input-output unit 66. The judging unit 68 may compare an expected value based on the test signal generated by the pattern generator 60 with the signal received from the signal input-output unit 66 to judge the quality of the semiconductor device 64. In addition, the pattern generator 60 may supply the expected value based on the generated test signal to the judging unit 68.

According to the semiconductor test apparatus 300 described in this embodiment, the timing signal can be highly accurately generated, so that the test of the semiconductor device 64 can be performed highly accurately because the test is based on the timing signal.

Figure 7:
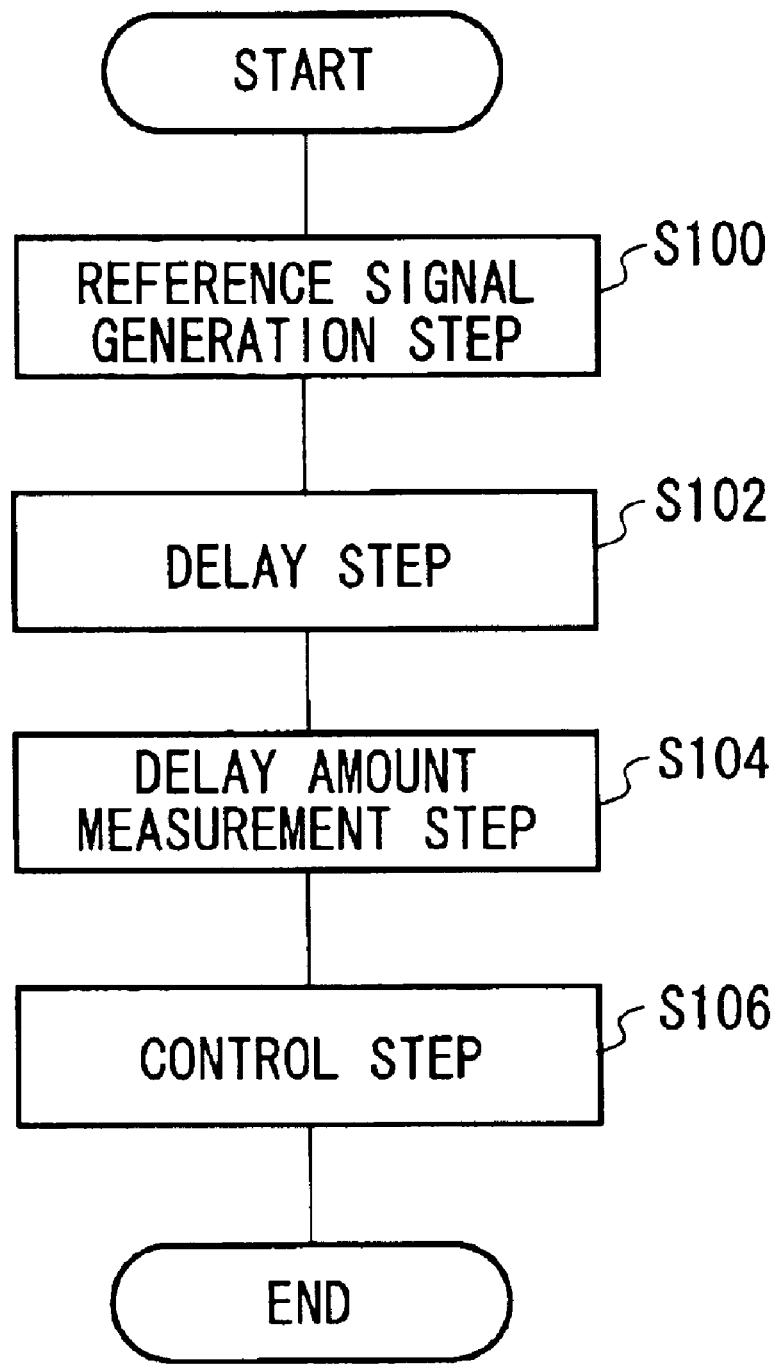
FIG. 7 shows a flowchart of a timing generating method in this invention.

FIG. 7 shows a flowchart of a timing generating method in this invention. The timing generating method is to delay a reference signal by a predetermined time in order to generate a timing signal. In a reference signal generation step, the reference signal of a predetermined frequency is generated (S100). The reference signal may be generated by using the reference signal generating unit 10 described in connection with FIGS. 3 to 5. In a delay step, the reference signal is inputted, and the timing signal which results from delaying the reference signal by a predetermined time is outputted (S102). The reference signal may be delayed as much as a predetermined time by the variable delay circuit unit 14 described in connection with FIGS. 3 to 5. In addition, S100 and S102 may be performed by one apparatus such as a quartz oscillator.

In a delay amount measurement step, the delay amount of the delay step is measured (S104). The delay amount of the delay step may be measured by the delay amount measuring unit 40 described in connection with FIGS. 3 to 5. In a control step, the delay amount of the delay step is controlled based on the delay amount measured in the delay amount measurement step (S106). The delay amount of the delay step may be controlled by the control unit 16 described in connection with FIGS. 3 to 5.

And the delay amount measurement step may include a signal feedback step of feeding back the timing signal to the input with regard to the delay step. In the delay amount measurement step, the frequency of the oscillating signal oscillated by feeding back the timing signal to the delay step in the signal feedback step is measured, and the delay amount of the delay step is calculated on the basis of the measured frequency of the oscillating signal. The timing signal may be fed back to the delay step by the signal feedback unit 50 described in connection with FIGS. 3 to 5.

Figure 4:
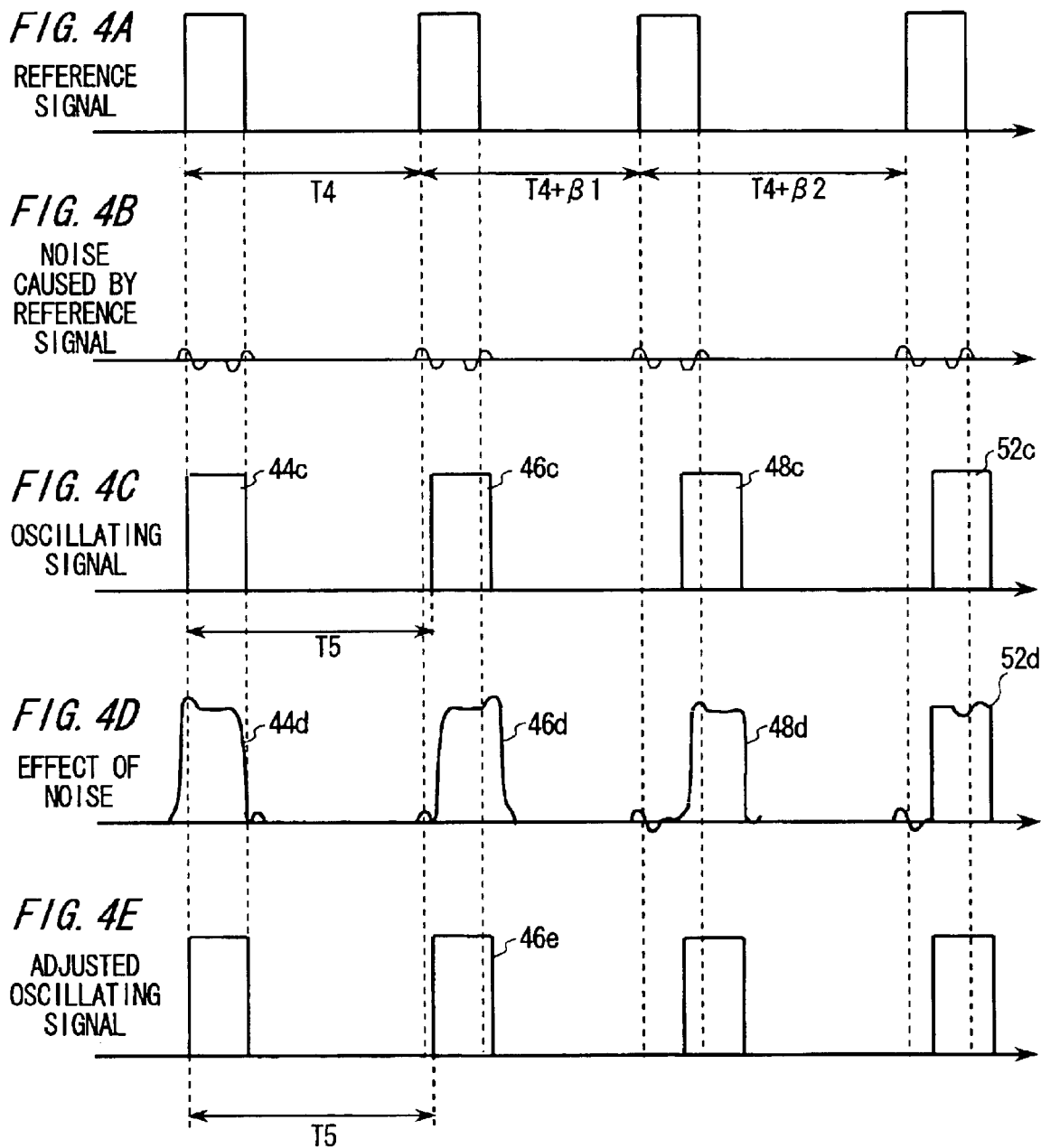
FIG. 4 shows an example of the period of an oscillating signal generated by the timing generator 200.

According to the timing generating method described above, like the timing generator described in connection with FIGS. 3 to 5, the delay amount of the reference signal in the delay step can be highly accurately measured, and the delay amount of the delay step can be highly accurately controlled.

Although the present invention has been described by way of exemplary embodiments, it should be understood that those skilled in the art might make many changes and substitutions without departing from the spirit and the scope of the present invention, which is defined only by the appended claims.

As obvious from the description above, according to the present invention, the timing of the generated timing signal can be highly accurately controlled. In addition, since the semiconductor test apparatus 300 can control the timing of the generated timing signal highly accurately, it is possible to judge the quality of the semiconductor device highly accurately.

What is claimed is:

1. A timing generator for generating a timing signal by delaying a reference signal as much as a predetermined time, comprising: a reference signal generating unit for generating said reference signal of a predetermined frequency; a modulating unit for modulating said frequency of said reference signal generated by said reference signal generating unit; a variable delay circuit unit for receiving said reference signal and outputting said timing signal which results from delaying said reference signal as much as a predetermined time; and a delay amount measuring unit for measuring a delay amount of said variable delay circuit unit.

2. A timing generator as claimed in claim 1, wherein said reference signal generating unit supplies said reference signal to a circuit comprising said variable delay circuit unit.

3. A timing generator as claimed in claim 1, wherein said modulating unit continues modulating said frequency of said reference signal for a predetermined time.

4. A timing generated as in claim 3, wherein said modulation unit modulates said frequency of said referenced signal within a few picoseconds to a few tens of picoseconds.

5. A timing generator as claimed in claim 1, wherein said delay amount measuring unit comprises a signal feedback unit for feeding back said timing signal to an input of said variable delay circuit unit, and said delay amount measuring unit measures a frequency of an oscillating signal oscillated because said signal feedback unit feeds back said timing signal to said variable delay circuit unit, and calculates said delay amount of said variable delay circuit unit based on said measured frequency of said oscillating signal.

6. A timing generator as claimed in claim 1, wherein said modulating unit comprises: a phase comparator for receiving two signals and outputting a phase difference signal of a voltage value based on a frequency difference between said two signals; an overlap unit for overlapping a modulation signal on said phase difference signal; a voltage-controlled variable frequency oscillator for receiving said phase difference signal overlapped by said modulation signal and outputting an output signal whose frequency increases or decreases in proportion to said voltage value of said phase difference signal; and a frequency divider for feeding back a period of said output signal multiplied by an integer to a first input of said phase comparator, and said reference signal is inputted to a second input of said phase comparator.

7. A timing generator as claimed in claim 6, wherein said overlap unit overlaps said modulation signal whose voltage value continues changing for a predetermined time on said phase difference signal.

8. A timing generated as in claim 7, wherein said modulation unit modulates said frequency of said referenced signal within a few picoseconds to a few tens of picoseconds.

9. A timing generator as claimed in claim 1 further comprising: a control unit for controlling said delay amount of said variable delay circuit unit based on said delay amount measured by said delay amount measuring unit.

10. A test apparatus for testing a semiconductor device, comprising: a pattern generating unit for generating a reference signal of a predetermined frequency and a test signal for a test of said semiconductor device; a timing generator for receiving said reference signal and outputting a timing signal which results from delaying said reference signal as much as a predetermined time; a waveform adjustor for receiving said test signal and timing signal and supplying an adjusted signal which results from delaying said test signal based on said timing signal to said semiconductor device; and a judging unit for receiving an output signal from said semiconductor device in response to said adjusted signal and judging quality of said semiconductor device based on said output signal, wherein said timing generator comprises: a modulating unit for modulating said frequency of said reference signal generated by said pattern generating unit; a variable delay circuit unit for receiving said reference signal and outputting said timing signal which results from delaying said reference signal as much as a predetermined time; and a delay amount measuring unit for measuring a delay amount of said variable delay circuit unit.

11. A timing generating method for generating a timing signal which results from delaying a reference signal as much as a predetermined time, comprising: a modulation step of modulating a frequency of said reference signal; a delay step of receiving said reference signal and outputting said timing signal which results from delaying said reference signal as much as a predetermined time; and a delay amount measurement step of measuring a delay amount of said delay step.

12. A timing generating method as claimed in claim 11 further comprising a control step of controlling said delay amount of said delay step based on said delay amount measured in said delay amount measurement step.

13. A timing generating method as claimed in claim 11, wherein said delay amount measurement step comprises a signal feedback step of feeding back said timing signal to an input with regard to said delay step, and in said delay amount measurement step, a frequency of an oscillating signal oscillated because said timing signal is fed back to said input with regard to said delay step in said signal feedback step is measured, and said delay amount of said delay step is calculated based on said measured frequency of said oscillating signal.

* * * * *